(12) United States Patent
Chu et al.

(10) Patent No.: US 6,387,757 B1
(45) Date of Patent: May 14, 2002

(54) SACRIFICIAL SELF ALIGNED SPACER LAYER ION IMPLANT MASK METHOD FOR FORMING A SPLIT GATE FIELD EFFECT TRANSISTOR (FET) DEVICE

(75) Inventors: Wen-Ting Chu, Kaohsiung County; Di-Son Kuo, Hsinchu; Jake Yeh, Hsin-Chu; Chia-Da Hsieh, Tainan; Chuan-Li Chang; Sheng-Wei Tsaur, both of Hsin-Chu, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/761,912

(22) Filed: Jan. 17, 2001

(51) Int. Cl.$^7$ .......................................... H01L 21/8247
(52) U.S. Cl. ...................................... 438/266
(58) Field of Search .......................................... 438/266

(56) References Cited

U.S. PATENT DOCUMENTS

| | | | | | |
|---|---|---|---|---|---|
| 4,814,286 A | * | 3/1989 | Tam | ........................... | 257/326 |
| 5,789,296 A | * | 8/1998 | Sung et al. | ................... | 438/266 |
| 5,872,036 A | * | 2/1999 | Sheu | ........................... | 438/266 |
| 5,930,631 A | * | 7/1999 | Wang et al. | ................. | 438/286 |
| 6,001,690 A | | 12/1999 | Chien et al. | | |
| 6,069,042 A | | 5/2000 | Chien et al. | | |
| 6,071,777 A | | 6/2000 | Chen | | |
| 6,091,104 A | | 7/2000 | Chen | | |
| 6,194,272 B1 | * | 2/2001 | Sung | ........................... | 438/266 |
| 6,232,185 B1 | * | 5/2001 | Wang | ........................... | 438/266 |

* cited by examiner

*Primary Examiner*—Richard Booth
(74) *Attorney, Agent, or Firm*—Tung & Associates

(57) ABSTRACT

Within a method for fabricating a split gate field effect transistor (FET) within a semiconductor integrated circuit microelectronic fabrication, there is employed a sacrificial self aligned spacer layer which defines a control gate electrode channel within the split gate field effect transistor (FET). The sacrificial self aligned spacer layer is employed as part of an ion implantation mask employed for forming a source/drain region adjoining the control gate electrode channel within the split gate field effect transistor (FET). The sacrificial self aligned spacer layer is stripped from over the control gate electrode channel prior to forming over the control gate electrode channel a control gate electrode within the split gate field effect transistor.

13 Claims, 1 Drawing Sheet

US 6,387,757 B1

SACRIFICIAL SELF ALIGNED SPACER LAYER ION IMPLANT MASK METHOD FOR FORMING A SPLIT GATE FIELD EFFECT TRANSISTOR (FET) DEVICE

BACKGROUND OF THE INVENTION

1. Field of the Invention

The present invention relates generally to methods for fabricating split gate field effect transistor (FET) devices, as employed within semiconductor integrated circuit microelectronic fabrications. More particularly, the present invention relates to methods for fabricating split gate field effect transistor (FET) devices with enhanced properties, as employed within semiconductor integrated circuit microelectronic fabrications.

2. Description of the Related Art

In addition to conventional semiconductor integrated circuit microelectronic fabrications having formed therein conventional field effect transistor (FET) devices and conventional bipolar junction transistor (BJT) devices whose transient operation provides for data storage and transduction capabilities within the conventional semiconductor integrated circuit microelectronic fabrications, there also exists within the art of semiconductor integrated circuit microelectronic fabrication non-volatile semiconductor integrated circuit microelectronic fabrications, and in particular non-volatile semiconductor integrated circuit microelectronic memory fabrications, such as but not limited to electrically erasable programable read only memory (EEPROM) non-volatile semiconductor integrated circuit microelectronic memory fabrications, whose data storage and transduction capabilities are not predicated upon transient operation.

Although non-volatile semiconductor integrated circuit microelectronic memory fabrications, such as but not limited to electrical erasable programmable read only memory (EEPROM) non-volatile semiconductor integrated circuit microelectronic memory fabrications, may be fabricated while employing any of several semiconductor integrated circuit microelectronic devices, a particularly common semiconductor integrated circuit microelectronic device employed within an electrically erasable programmable read only memory (EEPROM) non-volatile semiconductor integrated circuit microelectronic memory fabrication is a split gate field effect transistor (FET) device.

A split gate field effect transistor (FET) device is in part analogous in structure and operation with a conventional field effect transistor (FET) device insofar as a split gate field effect transistor (FET) device also comprises formed within a semiconductor substrate a channel region defined by a pair of source/drain regions also formed within the semiconductor substrate, wherein at least the channel region of the semiconductor substrate has formed thereupon a gate dielectric layer which separates a gate electrode from the channel region of the semiconductor substrate, but a split gate field effect transistor (FET) device is nonetheless distinguished from a conventional field effect transistor (FET) device by employing rather than a single gate electrode positioned upon the gate dielectric layer and completely covering the channel region of the semiconductor substrate: (1) a floating gate electrode positioned upon the gate dielectric layer and covering over only a portion of the channel region defined by the pair of source/drain regions (such portion of the channel region also referred to as a floating gate electrode channel region); and (2) a control gate electrode positioned over the gate dielectric layer and covering a remainder portion of the channel region while at least partially covering and overlapping the floating gate electrode while being separated from the floating gate electrode by an inter-gate electrode dielectric layer (such remainder portion of the channel region also referred to as a control gate electrode channel region).

In order to effect operation of a split gate field effect transistor (FET) device, particular sets of voltages are applied to the control gate electrode, the source/drain regions and the semiconductor substrate in order to induce or reduce charge within the floating gate electrode (which is otherwise fully electrically isolated) and thus provide conditions under which the floating gate electrode within the split gate field effect transistor (FET) device may be programmed, erased and/or read.

While split gate field effect transistor (FET) devices are thus desirable within the art of semiconductor integrated circuit microelectronic fabrication for providing semiconductor integrated circuit microelectronic fabrications with non-volatile data storage characteristics, split gate field effect transistor (FET) devices are nonetheless not entirely without problems in the art of semiconductor integrated circuit microelectronic fabrication.

In that regard, it is often difficult to form within non-volatile semiconductor integrated circuit microelectronic fabrications split gate field effect transistor (FET) devices with enhanced properties, and in particular with enhanced alignment properties.

It is thus towards the goal of providing for use within semiconductor integrated circuit microelectronic fabrications, and in particular within semiconductor integrated circuit microelectronic memory fabrications, methods for fabricating split gate field effect transistor (FET) devices with enhanced properties, and in particular with enhanced alignment properties, that the present invention is directed.

Various non-volatile semiconductor integrated circuit microelectronic devices with enhanced alignment properties, and methods for fabrication thereof, have been disclosed within the art of non-volatile semiconductor integrated circuit microelectronic fabrication.

For example, Chien et al., in U.S. Pat. Nos. 6,001,690 and 6,069,042, disclose a pair of methods for forming, with enhanced dimensional properties, self aligned spacer layers which in turn may be employed as ion implant mask layers for forming, with enhanced alignment properties, split gate field effect transistor (FET) devices within semiconductor integrated circuit microelectronic fabrications. To realize the foregoing objects, a first of the pair of methods employs a partial isotropic/anisotropic etching of a blanket silicon nitride layer when forming a self aligned silicon nitride spacer layer adjacent a floating gate electrode within a split gate field effect transistor (FET) device, rather than a solely anisotropic etching of the blanket silicon nitride layer when forming the self aligned silicon nitride spacer layer adjacent the floating gate electrode within the split gate field effect transistor (FET) device. In addition, and also to realize the foregoing objects, a second of the pair of methods employs a blanket multi-layer laminated silicon oxide/silicon nitride layer, rather than a blanket silicon nitride layer only, when forming while employing an anisotropic etching method a multi-layer laminated silicon oxide/silicon nitride spacer layer adjacent a floating gate electrode within a split gate field effect transistor (FET) device.

In addition, Chen, in U.S. Pat. No. 6,071,777, discloses a method for forming, with enhanced alignment of a drain region with respect to a floating gate electrode and thus with a resulting enhanced control gate electrode channel definition, a split gate field effect transistor (FET) device within a semiconductor integrated circuit microelectronic fabrication. To realize the foregoing object, the method employs a laminate of a doubly apertured patterned silicon nitride mask layer having formed asymmetrically thereupon a singly apertured patterned photoresist mask layer, wherein the laminate is successively delaminated in defining the drain region with respect to the floating gate electrode within the split gate field effect transistor (FET) device within the semiconductor integrated circuit microelectronic fabrication.

Finally, Chen, in U.S. Pat. No. 6,091,104, discloses a stacked gate field effect transistor (FET) device which may be fabricated with enhanced alignment for use within a semiconductor integrated circuit microelectronic fabrication. To realize the foregoing object, the stacked gate field effect transistor (FET) device employs a control gate electrode as a self aligning structure for forming self aligned thereto both a self aligned floating gate electrode within the stacked gate field effect transistor (FET) device and a self aligned select gate electrode within the stacked gate field effect transistor (FET) device.

Desirable within the art of non-volatile semiconductor integrated circuit microelectronic fabrication, and in particular within the art of non-volatile semiconductor integrated circuit microelectronic memory fabrication, are additional methods and materials which may be employed for forming split gate field effect transistor (FET) devices with enhanced properties, and in particular with enhanced alignment properties.

It is towards the foregoing object that the present invention is directed.

SUMMARY OF THE INVENTION

A first object of the present invention is to provide a method for fabricating, for use within a semiconductor integrated circuit microelectronic fabrication, a split gate field effect transistor (FET) device.

A second object of the present invention is to provide a method in accord with the first object of the present invention, wherein the split gate field effect transistor (FET) device is fabricated with enhanced properties.

A third object of the present invention is to provide a method in accord with the first object of the present invention and the second object of the present invention, wherein the method is readily commercially implemented.

In accord with the objects of the present invention, there is provided by the present invention a method for fabricating a split gate field effect transistor (FET) device. To practice the method of the present invention, there is first provided a semiconductor substrate having formed thereupon a gate dielectric layer in turn having formed thereupon a floating gate electrode which in turn defines a location of a floating gate electrode channel within the semiconductor substrate. There is then formed adjacent an edge of the floating gate electrode a self aligned spacer layer which defines a location of a control gate electrode channel within the semiconductor substrate. There is then formed within the semiconductor substrate at least in part while employing at least the self aligned spacer layer and the floating gate as a mask a first source/drain region adjoining the control gate electrode channel. There is then stripped from adjacent the floating gate the self aligned spacer layer. There is also formed upon the floating gate electrode an inter-gate electrode dielectric layer. There is also formed upon the inter-gate electrode dielectric layer, while fully covering the control gate electrode channel and partially covering the floating gate, a control gate. Finally, there is then formed into the semiconductor substrate at least in part while employing at least the control gate electrode and the floating gate electrode as a mask a second source/drain region adjoining the floating gate electrode channel.

The present invention provides a method for fabricating within a semiconductor integrated circuit microelectronic fabrication, and in particular within a non-volatile semiconductor integrated circuit microelectronic memory fabrication, a split gate field effect transistor (FET) device, where the split gate field effect transistor (FET) device is fabricated with enhanced properties, and in particular enhanced alignment properties. The present invention realizes the foregoing objects by employing when fabricating a split gate field effect transistor (FET) device, and self aligned adjacent a floating-gate electrode, a self aligned spacer layer for use as a mask over a control gate channel when forming adjoining the control gate channel a first source/drain electrode, further wherein the self aligned spacer layer is stripped from adjacent the floating gate electrode prior to forming over the control gate channel a control gate electrode.

The method of the present invention is readily commercially implemented. A split gate field effect transistor (FET) device fabricated in accord with method of the present invention employs process steps and materials as are generally known in the art of semiconductor integrated circuit microelectronic fabrication, including but not limited to non-volatile semiconductor integrated circuit microelectronic memory fabrication, but employed within the context of a novel ordering and sequencing of process steps to provide the method in accord with the present invention. Since it is thus a novel ordering and sequencing of process steps which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating within a semiconductor integrated circuit microelectronic fabrication, and in particular within a non-volatile semiconductor integrated circuit microelectronic memory fabrication, a split gate field effect transistor (FET) device, where the split gate field effect transistor (FET) device is fabricated with enhanced properties, and in particular enhanced alignment properties. The present invention realizes the foregoing objects by employing when fabricating a split gate field effect transistor (FET) device, and self aligned adjacent a floating gate electrode, a self aligned spacer layer for use as a mask over a control gate channel when forming adjoining the control gate channel a first source/drain electrode, further wherein the self aligned spacer layer is stripped from adjacent the floating gate electrode prior to forming over the control gate channel a control gate electrode.

A split gate field effect transistor (FET) device fabricated in accord with the method of the present invention may be fabricated within a non-volatile semiconductor integrated circuit microelectronic fabrication such as but not limited to a non-volatile semiconductor integrated circuit microelectronic memory fabrication such as but not limited to an electrically erasable programmable read only memory (EEPROM) semiconductor integrated circuit microelectronic memory fabrication such as but not limited to a flash memory fabrication.

Figure 1:
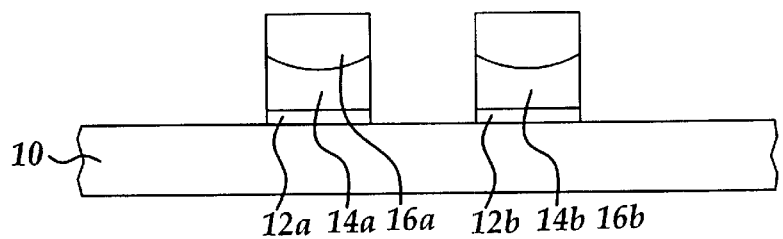
FIG. 1, FIG. 2 and FIG. 3 show a series of schematic cross-sectional diagrams illustrating the results of progressive stages of fabricating within a semiconductor integrated circuit microelectronic fabrication, and in accord with a preferred embodiment of the present invention, a pair of split gate field effect transistor (FET) devices.
Figure 2:
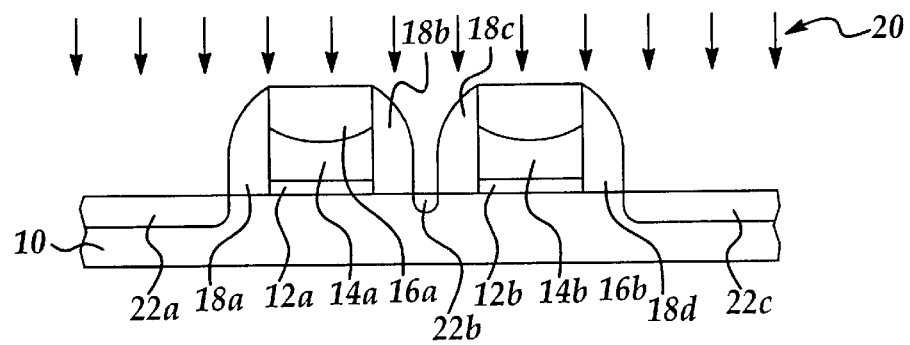
Figure 3:
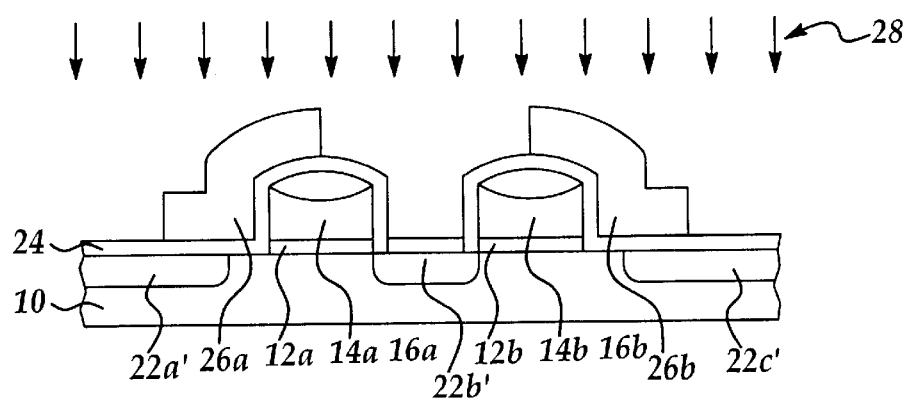

Referring now to FIG. 1 to FIG. 3, there is shown a series of schematic cross-sectional diagrams illustrating the results of progressive stages in forming within a semiconductor integrated circuit microelectronic fabrication, and in accord with a preferred embodiment of the present invention, a pair of split gate field effect transistor (FET) devices.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate. 10 having formed thereupon a pair of patterned gate dielectric layers 12a and 12b, in turn having formed thereupon a pair of floating gate electrodes 14a and 14b, in turn having formed thereupon a pair of patterned silicon oxide hard mask layers 16a and 16b.

Within the preferred embodiment of the present invention with respect to the semiconductor substrate 10, although it is known in the art of semiconductor integrated circuit microelectronic fabrication that semiconductor substrates may be formed with either dopant polarity, several dopant concentrations and various crystallographic orientations, for the preferred embodiment of the present invention, the semiconductor substrate 10 is typically and preferably a (100) silicon semiconductor substrate having an N- or P- doping of sufficient concentration to impart a bulk resistivity of from about 8 to about 12 ohm-cm to the semiconductor substrate 10.

Similarly, within the preferred embodiment of the present invention with respect to the pair of patterned gate dielectric layers 12a and 12b, although it is also known in the art of semiconductor integrated circuit microelectronic fabrication that gate dielectric layers may be formed employing methods including but not limited to gate dielectric layer thermal growth methods and gate dielectric layer deposition/patterning methods, for the preferred embodiment of the present invention, the pair of patterned gate dielectric layers 12a and 12b is typically and preferably formed employing a gate dielectric layer thermal growth method at a temperature of form about 800 to about 1100 degrees centigrade to form the pair of patterned gate dielectric layers 12a and 12b of silicon oxide of thickness from about 30 to about 110 angstroms formed upon the semiconductor substrate 10.

Similarly, within the preferred embodiment of the present invention with respect to the pair of floating gate electrodes 14a and 14b, although it is known in the art of semiconductor integrated circuit microelectronic fabrication, including in particular semiconductor integrated circuit microelectronic memory fabrication, that floating gate electrodes may be formed of conductor materials including but not limited to metal, metal alloy, doped polysilicon (having a dopant concentration of greater than about 1E18 dopant atoms per cubic centimeter) and polycide (doped polysilicon/metal silicide stack) conductor materials, for the preferred embodiment of the present invention, the pair of floating gate electrodes 14a and 14b is typically and preferably formed employing a doped polysilicon conductor material formed to a thickness which varies from about 300 to about 1500 angstroms in order to define a pair of concave interfaces (or surfaces) of the pair of floating gate electrodes 14a and 14b, along with a series of sharp tips of the pair of floating gate electrodes 14a and 14b, in conjunction with a pair of convex interfaces (or surfaces) of the pair of patterned silicon oxide hard mask layers 16a and 16b.

Finally, within the preferred embodiment of the present invention with respect to the pair of patterned silicon oxide hard mask layers 16a and 16b, the pair of patterned silicon oxide hard mask layers 16a and 16b is typically and preferably formed employing a blanket silicon oxide layer deposition and planarization method while employing a patterned silicon nitride layer as an etch back planarization stop layer or chemical mechanical polish (CMP) planarization stop layer. Typically and preferably each of the patterned silicon oxide hard mask layers 16a and 16b is formed to a thickness of from about 1000 to about 4000 angstroms.

Thus, and as is understood by a person skilled in the art, when forming the semiconductor integrated circuit microelectronic fabrication whose schematic cross-sectional diagram is illustrated in FIG. 1, there is first formed upon the semiconductor substrate 10 a blanket gate dielectric layer from which is formed the pair of patterned gate dielectric layers 12a and 12b. There is in turn formed upon the blanket gate dielectric layer a blanket doped polysilicon layer from which is formed the pair of floating gate electrodes 14a and 14b. In turn, to form the pair of patterned silicon oxide hard mask layers 16a and 16b, there is first formed upon the blanket doped polysilicon layer a patterned silicon nitride layer which first serves as an etch mask for forming within a pair of portions of the blanket polysilicon layer exposed beneath the patterned silicon nitride layer, a pair of concave pits which eventually provide the pair of floating gate electrodes 14a and 14b with the pair of concave interfaces (or surfaces) and the series of sharp tips as illustrated within the schematic cross-sectional diagram of FIG. 1. There is then formed upon the patterned silicon nitride layer and filling the pair of concave pits a blanket silicon oxide hard mask layer which is etched back or polished back to form the pair of patterned silicon oxide hard mask layers 16a and 16b. After stripping the patterned silicon nitride layer, the pair of patterned silicon oxide hard mask layers 16a and 16b may then be employed as a pair of self aligned etch mask layers for forming from remaining portions of the blanket polysilicon layer and the blanket gate dielectric layer the corresponding pair of floating gate electrodes 14a and 14b, and the corresponding pair of patterned gate dielectric layers 12a and 12b.

As is further understood by a person skilled in the art, each of the pair of floating gate electrodes 14a and 14b defines a floating gate electrode channel of corresponding projected width within the semiconductor substrate 10. Typically and preferably, each of the floating gate electrode channels has a linewidth of from about 0.05 to about 0.5 microns.

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein, in a first instance, there is formed adjacent to the two pair of opposite edges of the pair of floating gate electrodes 14a and 14b a series of four self aligned spacer layers 18a, 18b, 18c and 18d. As is understood by a person skilled in the art, the series of four self aligned spacer layers 18a, 18b, 18c and 18d is formed while anisotropically etching a blanket layer of spacer material formed conformally upon the semiconductor integrated circuit microelectronic fabrication whose schematic cross-sectional diagram is illustrated in FIG. 1, including exposed portions of the pair of patterned gate dielectric layers 12a and 12b, the pair of floating gate electrodes 14a and 14b and the pair of patterned silicon oxide hard mask layers 16a and 16b.

Although within the context of the present invention the series of self aligned spacer layers 18a, 18b, 18c and 18d may be formed from any of several microelectronic materials, including but not limited to microelectronic conductor materials, microelectronic semiconductor materials and microelectronic dielectric materials, for the preferred embodiment of the present invention, the series of self aligned spacer layers 18a, 18b, 18c and 18d is typically and preferably formed of a silicon nitride microelectronic dielectric material.

As is further understood by a person skilled in the art, and in accord with further processing of the semiconductor integrated circuit microelectronic fabrication whose schematic cross-sectional diagram is illustrated in FIG. 2, the pair of self aligned spacer layers 18a and 18d defines a pair of control gate electrode channels within the semiconductor substrate 10 adjoining the pair of floating gate electrode channels within the semiconductor substrate 10, further within a pair of split gate field effect transistor (FET) devices which results from further processing of the semiconductor integrated circuit microelectronic fabrication whose schematic cross-sectional diagram is illustrated in FIG. 2. Within the preferred embodiment of the present invention, each of the pair of control gate electrode channels is formed to a linewidth of from about 0.03 to about 0.5 microns beneath each of the pair of self aligned spacer layers 18a and 18d.

Shown also within the schematic cross-sectional diagram of FIG. 2 is a series of singly implanted source/drain regions 22a, 22b and 22c which result from implanting into regions of the semiconductor substrate 10 exposed adjacent the series of self aligned spacer layers 18a, 18b, 18c and 18d a dose of first implanting ions 20. Typically and preferably, the dose of first implanting ions 20 employs an implanting ion which is of comparatively limited thermal diffusivity (e.g., arsenic). Similarly, the dose of first implanting ions 20 is provided at an ion implantation dose of from about $10^{12}$ to about $10^{16}$ dopant ions per square centimeter and an ion implantation energy of from about 3 to about 100 keV while employing at least the pair of self aligned spacer layers 18a and 18b (and generally the series of self aligned spacer layers 18a, 18b, 18c and 18d) and the pair of floating gate electrodes 14a and 14b, as a mask, but not employing a pair of control gate electrodes as a mask.

Figure 4:
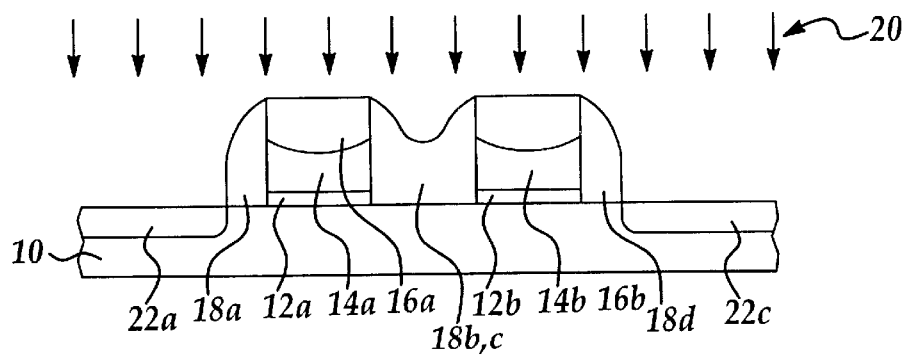
FIG. 4 illustrates an alternative embodiment of the invention.

As is further understood by a person skilled in the art, and under circumstances where the pair of floating gate electrodes 14a and 14b is sufficiently closely spaced over the semiconductor substrate 10, and in particular within the context of the preferred embodiment of the present invention at a spacing of from about 0.05 to about 0.8 microns, it is common for the pair of self aligned spacer layers 18b and 18c to merge into one contiguous self aligned spacer layer, which given sufficient thickness may preclude entirely the formation of the singly implanted source/drain region 22b within the semiconductor substrate 10. Shown in FIG. 4 is a schematic cross-sectional diagram of such a semiconductor integrated circuit microelectronic fabrication, which is derived from the semiconductor integrated circuit microelectronic fabrication whose schematic cross-sectional diagram is illustrated in FIG. 2, but wherein the pair of self aligned spacer layers 18b and 18b has been merged to form a contiguous self aligned spacer layer 18b/c which covers completely a portion of the semiconductor substrate interposed between the pair of floating gate electrodes 14a and 14b, and wherein the singly implanted source/drain region 22b is absent. As is implicit and intended within the foregoing disclosure, and as is understood by a person skilled in the art, the semiconductor integrated circuit microelectronic fabrication whose schematic cross-sectional diagram is illustrated in FIG. 4 may be further processed in accord with the semiconductor integrated circuit microelectronic fabrication whose schematic cross-sectional diagram is illustrated in FIG. 2.

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, the series of self aligned spacer layers 18a, 18b, 18c and 18d has been stripped from adjoining the pair of patterned gate dielectric layers 12a and 12b, the pair of floating gate electrodes 14a and 14b and the pair of patterned silicon oxide hard mask layers 16a and 16b. Within the preferred embodiment of the present invention, the series of self aligned spacer layers 18a, 18b, 18c and 18d may be stripped from adjoining the pair of patterned gate dielectric layers 12a and 12b, the pair of floating gate electrodes 14a and 14b and the pair of patterned silicon oxide hard mask layers 16a and 16b while employing stripping methods as are conventional in the art of semiconductor integrated circuit microelectronic fabrication, wherein under circumstances where the pair of patterned silicon oxide hard mask layers 16a and 16b is formed of a silicon oxide hard mask material and the series of self aligned spacer layers 18a, 18b, 18c and 18d is formed of a silicon nitride dielectric material such stripping may be effected while employing an aqueous phosphoric acid solution at elevated temperature.

There is also shown within the schematic cross-sectional diagram of FIG. 3, after having stripped therefrom the series of self aligned spacer layers 18a, 18b, 18c and 18d, a blanket inter-gate dielectric layer 24 formed covering the semiconductor integrated circuit microelectronic fabrication including portions of the semiconductor substrate 10, the pair of patterned gate dielectric layers 12a and 12b, the pair of floating gate electrodes 14a and 14b and the pair of patterned silicon oxide hard mask layers 16a and 16b.

Within the preferred embodiment of the present invention with respect to the blanket inter-gate electrode dielectric layer 24, although the blanket inter-gate electrode dielectric layer 24 may be formed of inter-gate electrode dielectric materials including but not limited to silicon oxide inter-gate electrode dielectric materials, silicon nitride inter-gate electrode dielectric materials and silicon oxynitride inter-gate electrode dielectric materials, laminates thereof and aggregates thereof, for the preferred embodiment of the present invention, the blanket inter-gate electrode dielectric layer 24 is typically and preferably formed at least in part of a silicon oxide inter-gate electrode dielectric material. Typically and preferably, the blanket inter-gate electrode dielectric layer 24 is formed to a thickness of from about 100 to about 300 angstroms.

Similarly, there is also shown within the schematic cross-sectional diagram of FIG. 3 formed upon the blanket inter-gate electrode dielectric layer 24 and completely covering each of the control gate electrode channels and partially covering adjacent portions of the pair of floating gate electrodes 14a and 14b which in turn define the pair of floating gate electrode channels adjoining the control gate electrode channels a pair of control gate electrodes 26a and 26b (which may under certain circumstances also completely cover the pair of singly implanted source/drain regions 22a and 22c).

Within the preferred embodiment of the present invention with respect to the pair of control gate electrodes 26a and 26b, the pair of control gate electrodes 26a and 26b may be formed of control gate materials as are conventional in the art of semiconductor integrated circuit microelectronic fabrication, such control gate materials including but not limited to metal, metal alloy, doped polysilicon and polycide control gate materials, although doped polysilicon control gate materials are most common in the art of semiconductor integrated circuit microelectronic fabrication. Typically and preferably, each of the pair of control gate electrodes 26a and 26b is formed to a thickness of from about 500 to about 4000 each.

Finally, there is shown within the schematic cross-sectional diagram of FIG. 3 a series of doubly implanted source/drain regions 22a', 22b' and 22c' which is formed from the series of singly implanted source/drain regions 22a, 22b and 22c through ion implantation with a dose of second implanting ions 28 and in particular while employing at least the pair of control gate electrodes 26a and 26b, and the pair of floating gate electrodes 14a and 14b, but not a corresponding series of self aligned spacer layers, as a second pair of ion implant mask layers.

Within the preferred embodiment of the present invention, the dose of second implanting ions 28 is typically and preferably provided employing an appropriate second dopant ion (of polarity equivalent to the first dopant ion) at an ion implantation dose of from about $10^{12}$ to about $10^{16}$ ions per square centimeter and an ion implantation energy of from about 5 to about 100 keV. Similarly, within the preferred embodiment of the present invention, typically and preferably, the second implanting ions 28 when implanted within the semiconductor substrate 10 have a comparatively higher diffusivity (i.e., phosphorus) in comparison with the first implanting ions 20 when implanted into the semiconductor substrate 10. Similarly, as is understood by a person skilled in the art, under circumstances where the pair of control gate electrodes 26a and 26b completely cover the corresponding pair of singly implanted source/drain regions 22a and 22c, there is not formed therefrom a corresponding pair of doubly implanted source/drain regions 22a' and 22c'.

Although not specifically illustrated within the schematic cross-sectional diagram of FIG. 3, the semiconductor integrated circuit microelectronic fabrication whose schematic cross-sectional diagram is illustrated in FIG. 3 is typically and preferably thermally annealed to provide a series of thermally annealed doubly implanted source/drain regions from the series of doubly implanted source/drain regions 22a', 22b' and 22c'. Under such thermal annealing conditions, the doubly implanted source/drain regions 22b' which typically and preferably serves as a common source region for the pair of split gate field effect transistor (FET) devices whose schematic cross-sectional diagram is illustrated in FIG. 3, will typically and preferably diffuse further beneath the pair of floating gate electrodes 14a and 14b in order to provide more optimal coupling to the pair of floating gate electrodes 14a and 14b. Similarly, since the pair of control gate electrodes 26a and 26b extends completely covering the pair of control gate electrode channel regions and covering in part over the pair of doubly implanted source/drain regions 24a' and 24c', the pair of doubly implanted source/drain regions 24a' and 24c' is unlikely to diffuse into the control gate electrode channel regions upon thermal annealing when the above thermal diffusivity conditions are met.

As is understood by a person skilled in the art, although the preferred embodiment of the present invention illustrates the present invention within the context of forming within a microelectronic fabrication and stripping from within the microelectronic fabrication the series of self aligned spacer layers 18a, 18b, 18c and 18d prior to forming within the microelectronic fabrication the blanket inter-gate electrode dielectric layer 24, it is also within the scope of the present invention to form first the blanket inter-gate electrode dielectric layer 24 upon exposed portions of the semiconductor substrate, the pair of patterned gate dielectric layers 12a and 12b, the pair of floating gate electrodes 14a and 14b and the pair of patterned silicon oxide hard mask layers 16a and 16b and then form thereupon and strip therefrom an analogous series of self aligned spacer layers which are thus formed adjacent the pair of floating gate electrodes 14a and 14b.

Upon forming the semiconductor integrated circuit microelectronic fabrication whose schematic cross-sectional diagram is illustrated in FIG. 3, there is formed within the context of the present invention and the preferred embodiment of the present invention a pair of split gate field effect transistor (FET) devices with enhanced properties, and in particular enhanced registration properties. The enhanced registration properties are effected at least in part by employing a sacrificial self aligned spacer layer for defining a control gate electrode channel within the split gate field effect transistor (FET) device.

As is understood by a person skilled in the art, the preferred embodiment of the present invention is illustrative of the present invention rather than limiting of the present invention. Revisions and modifications may be made to methods, materials and dimensions employed within a method for fabricating a split gate field effect transistor in accord with the preferred embodiment of the present invention while still providing a method for fabricating a split gate field effect transistor in accord with the present invention, further in accord with the accompanying claims.

What is claimed is:

1. A method for fabricating a pair of split gate field effect transistors comprising:
   providing a semiconductor substrate having formed thereupon a gate dielectric layer in turn having formed thereupon a pair of floating gate electrodes which in turn defines a pair of locations of a pair of floating gate electrode channels within the semiconductor substrate;

forming adjacent a pair of opposite edges of the pair of floating gate electrodes a pair of self aligned spacer layers which defines a pair of locations of a pair of control gate electrode channels within the semiconductor substrate and forming interposed between the pair of floating gate electrodes a single contiguous third self aligned spacer layer which covers the semiconductor substrate interposed between the pair of floating gate electrodes;

forming within the semiconductor substrate at least in part while employing at least the pair of self aligned spacer layers, the third self aligned spacer layer and the pair of floating gate electrodes as a mask a pair of first source/drain regions adjoining the pair of control gate electrode channels, but not interposed between the pair of floating gate electrodes;

stripping from adjacent and interposed between the pair of floating gate electrodes the pair of self aligned spacer layers and the third self aligned spacer layer;

forming upon the pair of floating gate electrodes an inter-gate electrode dielectric layer;

forming upon the inter-gate electrode dielectric layer, while fully covering the pair of control gate electrode channels and partially covering the pair of floating gate electrodes, a pair of control gate electrodes; and forming into the semiconductor substrate at least in part while employing at least the pair of control gate electrodes and the pair of floating gate electrodes as a mask a second source/drain region interposed between the pair of floating gate electrodes.

2. The method of claim 1 wherein the gate dielectric layer is formed to a thickness of from about 30 to about 110 angstroms.

3. The method of claim 1 wherein each of the pair of floating gate electrodes is formed to a thickness of from about 300 to about 1500 angstroms.

4. The method of claim 1 wherein each of the pair of floating gate electrodes is formed with a concave upper surface.

5. The method of claim 1 wherein each of the pair of self aligned spacer layers and the third self aligned spacer layer is formed from a material selected from the group consisting of conductor materials, semiconductor materials and dielectric materials.

6. The method of claim 1 wherein the inter-gate dielectric layer is formed to a thickness of from about 100 to about 300 angstroms.

7. The method of claim 1 wherein the inter-gate dielectric layer is formed upon the pair of floating gate electrodes before forming adjacent to the pair of floating gate electrodes and stripping from adjacent to the pair of floating gate electrodes the pair of self aligned spacer layers.

8. The method of claim 1 wherein the inter-gate dielectric layer is formed upon the pair of floating gate electrodes after forming adjacent to the pair of floating gate electrodes and stripping from adjacent to the pair of floating gate electrodes the pair of self aligned spacer layers.

9. The method of claim 1 wherein the pair of control gate electrodes is formed to a thickness of from about 500 to about 4000 angstroms.

10. The method of claim 1 wherein:
   the pair of floating gate electrodes defines a pair of floating gate electrode channel widths of from about 0.05 to about 0.5 microns within the semiconductor substrate; and
   the pair of self aligned spacer layers defines a pair of control gate electrode channel widths of from about 0.03 to about 0.5 microns within the semiconductor substrate.

11. The method of claim 1 wherein there is not employed as a mask an additional self aligned spacer layer when forming the second source/drain region within the semiconductor substrate.

12. The method of claim 1 wherein:
   the pair of first source/drain regions is formed predominantly employing a first dopant;
   the second source/drain region is formed predominantly employing a second dopant; and
   the first dopant has a lower thermal diffusivity than the second dopant.

13. The method of claim 1 wherein:
   the pair of first source/drain regions serves as a pair of drain regions within the pair of split gate field effect transistors; and
   the second source/drain region serves as a shared source region within the pair of split gate field effect transistors.

\* \* \* \* \*